United States Patent [19]

Hunt et al.

[11] Patent Number: 5,162,885
[45] Date of Patent: Nov. 10, 1992

[54] ACOUSTIC CHARGE TRANSPORT IMAGER

[75] Inventors: William D. Hunt; Kevin F. Brennan, both of Atlanta; Christopher J. Summers, Dunwoody, all of Ga.

[73] Assignee: Georgia Tech Research Corporation, Atlanta, Ga.

[21] Appl. No.: 578,815

[22] Filed: Sep. 7, 1990

[51] Int. Cl.$^5$ .................. H01L 29/78; H01L 27/14; H01L 29/66
[52] U.S. Cl. ........................ 257/55; 257/245; 257/438
[58] Field of Search ............. 357/24 L, 24 R, 24, 357/30 R, 30 H, 30 P, 25, 30 A

[56] References Cited

U.S. PATENT DOCUMENTS

| | | | |
|---|---|---|---|
| 4,028,565 | 6/1977 | Davis | 357/26 |
| 4,084,192 | 4/1978 | Defranould et al. | 357/30 R |
| 4,208,548 | 6/1977 | Scott | 357/30 R |
| 4,291,390 | 9/1981 | Stern et al. | 357/24 LR |
| 4,633,285 | 12/1986 | Hunsinger et al. | 357/24 |
| 4,799,244 | 1/1989 | Mikoshiba et al. | 357/24 |
| 4,906,894 | 3/1990 | Miyawaki et al. | 357/30 P |

OTHER PUBLICATIONS

Unnai et al., "Newly developed high-sensitivity HDTV camera tube", 1989 *Hitachi Review* 38:121–126.
Hoskins et al., "High Speed GaAs acoustic charge transport multiplexer", 1989, *Optical Sensors and Electronic Photography* 1071:99–106.
Merritt et al., "Heterojunction Acoustic-charge Transport Fixed-Tap Transversal Filter", 1990, *IEEE Electron Device Letters* 11:107–109.
Merritt et al., "A 3.35 Microsecond HACT Transversal Filter", 1989 *IEEE 1989 Ultrasonic Symposium Proceedings* pp. 213–216.
Tanski et al., "Heterojunction Acoutic-charge Transport Devices on GaAs", 1988, *Applied Physics Letters* 52(1):18–20.
Miller et al., "Modeled and Measured ACT Based Convolver Performance", 1987 *IEEE 1987 Ultrasonic Symposium Proceedings* pp. 25–29.
Okano et al., "Harpo-HDTV High Sensitivity, Hand-Held Camera", 1989 *NAB Engineering Conference Proceedings* pp. 331–337.
Tanioka et al., "An Avalanche-Mode Amorphous Selenium Photoconductive Layer for Use as a Camera Tube Target", 1987 *IEEE Electron Device Letters* 8:392–394.
Harada et al., "A High-Resolution Staggered-Configuration CCD Imager Overlaid with an a-Si:H Photoconductive Layer", 1985 *IEEE Transactions on Electron Devices* 32:1499–1504.
Chikamura et al., "A ½ inch CCD Image Sensor Overlaid with a Hydrogenated Amorphous Silicon", 1985 *IEEE Transaction on Electron Devices* 32:1495–1498.
Ishikoa et al., "Image Pickup Tubes", 1984, *Semiconductors and Semi Metals* 21D:75–87.

*Primary Examiner*—Andrew J. James
*Assistant Examiner*—Ngan Van Ngo
*Attorney, Agent, or Firm*—Needle & Rosenberg

[57] ABSTRACT

An Acoustic Charge Transport Imager, suitable for use as a High Definition Television (HDTV) camera element, is disclosed in which an array of amorphous hydrogenated silicon based avalanche photodiodes are combined with acoustic charge transport channels in a GaAs substrate, to achieve very high speed read out of photogenerated charge. High speed read out allows the fabrication of detector arrays large enough to meet the resolution requirements of HDTV while ensuring operation within the timing constraints of the HDTV frame rate.

22 Claims, 2 Drawing Sheets

ACOUSTIC CHARGE TRANSPORT IMAGER

BACKGROUND OF THE INVENTION

This invention relates to a single chip, low cost camera element for High Definition Television (HDTV). More specifically the invention relates to the use of acoustic charge transport in a gallium arsenide (GaAs) substrate to achieve high speed read out of photogenerated electric charge.

Existing HDTV cameras utilize a vacuum tube as the detecting element. One example of such a tube is the HARPICON H4318 manufactured by Hitachi. Although the HARPICON H4318 camera tube provides low noise, high sensitivity performance for HDTV applications, a camera using this tube is relatively large, fragile and heavy. Therefore, it is not well suited for use in light-weight applications such as hand-held HDTV broadcast cameras, camcorders, or space applications. For these applications a compact, light-weight, completely solid state device is ideal.

The conventional choice for a solid-state camera chip is one which uses a charge coupled device (CCD) to read out the image charge. However, there is presently only one CCD camera for HDTV which can operate at the required video frame rate. This camera, manufactured by Toshiba, is very costly and therefore unsuitable for consumer applications.

The HARPICON H4318 achieves high sensitivity and resolution by avalanche multiplication induced gain within the detection stage, which is made from amorphous selenium (a-Se). However, the use of an a-Se detector stage means that hole transport and collection are required because the hole ionization rate is substantially higher than the electron ionization rate in a-Se. Hole transport is not compatible with high speed integrated circuit operation.

Therefore, there is a need for a small, low-cost, low voltage, easy to manufacture, reliable, high resolution HDTV camera element, capable of read out speeds compatible with HDTV frame rate requirements.

SUMMARY OF THE INVENTION

Accordingly, the general object of the invention is to provide a means for detecting light in the visible spectrum with an imager array sufficiently large to achieve HDTV resolution and to couple the imager array to a means for read out which operates at sufficiently high speeds so as to achieve compatibility with HDTV frame rates. The device of the present invention would also be suited for many special types of fast imaging applications, such as high resolution super-slow-motion or fast processing applications, such as on-chip image enhancement.

It is an object of the present invention to couple a low-noise, high-gain photodetector element to a means capable of high speed charge read out.

It is another object of the present invention to monolithically combine heterostructure acoustic charge transport (ACT) devices and amorphous hydrogenated silicon avalanche photodiodes (APD).

It is a further object of the present invention to achieve an imager architecture which is both acoustically and optically efficient.

It is a further object of the present invention to provide a solid-state camera chip for HDTV applications.

It is a further object of this invention to provide such a chip which is small and efficient enough to be used in camcorders and space applications.

It is yet a further object of this invention to provide such a chip made from an ACT structure in a GaAs substrate and an APD constructed from amorphous silicon to provide an efficient and integrated system for use with HDTV equipment.

It is still a further object of this invention to provide such a chip which globally optimizes performance of the heterostructure by balancing the photodetector and ACT read out structure design parameters.

The invention comprises four main components: (1) a photodetector which may be an amorphous silicon avalanche photodiode (APD), or a superlattice APD, (2) an npn bipolar junction transistor (BJT) to provide charge storage and clamping action, (3) an acoustic charge transport (ACT) structure in which charge is read out for image reconstruction, and (4) a metal-insulator-semiconductor field effect transistor (MISFET) structure to controllably transfer, that is gate, the stored charge into the ACT channel. These four components are integrated in a compact, completely solid-state device suitable for use in light-weight applications such as hand-held HDTV broadcast cameras, camcorders or space applications. This structural combination of the present invention is novel.

Several materials choices are available for both the photodetector and ACT structures. The photodetector may be silicon based or fabricated from a compound semiconductor material system. Although a GaAs photodetector has certain theoretical advantages, such as improved gain, over a silicon photodetector, the GaAs photodetector has a number of problems related to manufacturability. The substrate in which the ACT structure resides may be GaAs/AlGaAs or some other material system such as silicon with an associated piezoelectric layer. Any substrate material system, or combination, that supports acoustic charge transport can be used.

In the preferred embodiment, the APD is made from an amorphous silicon. This type of APD uses electrons as the initiating carriers, allowing it to yield low noise performance while still being compatible with the ACT component. The particular advantage of amorphous silicon is its reproducibility, cost effectiveness, uniformity, and potential low noise performance.

The charge from the APD is collected in the emitter region of a bipolar junction transistor (BJT) and is then gated into an ACT channel. The ACT component to which the APD is coupled in the preferred embodiment utilizes a GaAs/AlGaAs structure which is capable of very high speed, high efficiency charge transfer, thus enabling higher frame rates than have previously been possible with charge coupled devices (CCDs). The speed of the ACT can be attributed to high electron mobility and a potential which is propagated with a surface acoustic wave (SAW) instead of a potential imposed by clock pulses, as can be found in previously existing CCDs.

DETAILED DESCRIPTION OF THE INVENTION

The preferred embodiment of the invention is now described with reference to the drawings.

1. Electrical Connectivity

Figure 1:
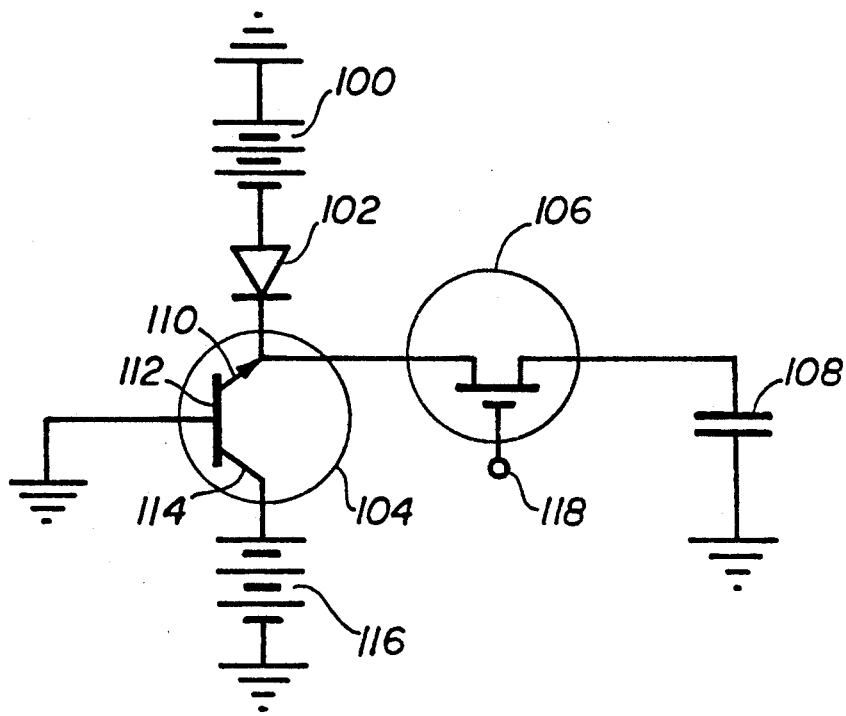
FIG. 1 is a circuit schematic representing one imager cell showing the interconnections between the APD, the BJT, the MISFET transfer gate and the ACT channel.

Referring now to FIG. 1, there is shown a schematic representation of one cell of the acoustic charge transport imager in accordance with the present invention. The cell includes an avalanche photodiode (APD) 102, an npn bipolar junction transistor (BJT) 104, a MISFET 106, and an acoustic charge transport channel represented here as a capacitor 108. The APD 102 has its p region Connected to a voltage source 100 which is negative with respect to ground The emitter 110 of BJT 104 forms a common node with the n region of APD 102. The base 112 of BJT 104 is connected to ground. The collector 114 of BJT 104 is connected to the positive voltage supply 116 of the substrate. The common node of BJT 104 and APD 102 is coupled to the ACT channel 108 through the MISFET 106. A control signal is connected to the MISFET gate 108 terminal.

2. Physical Structure

Figure 2:
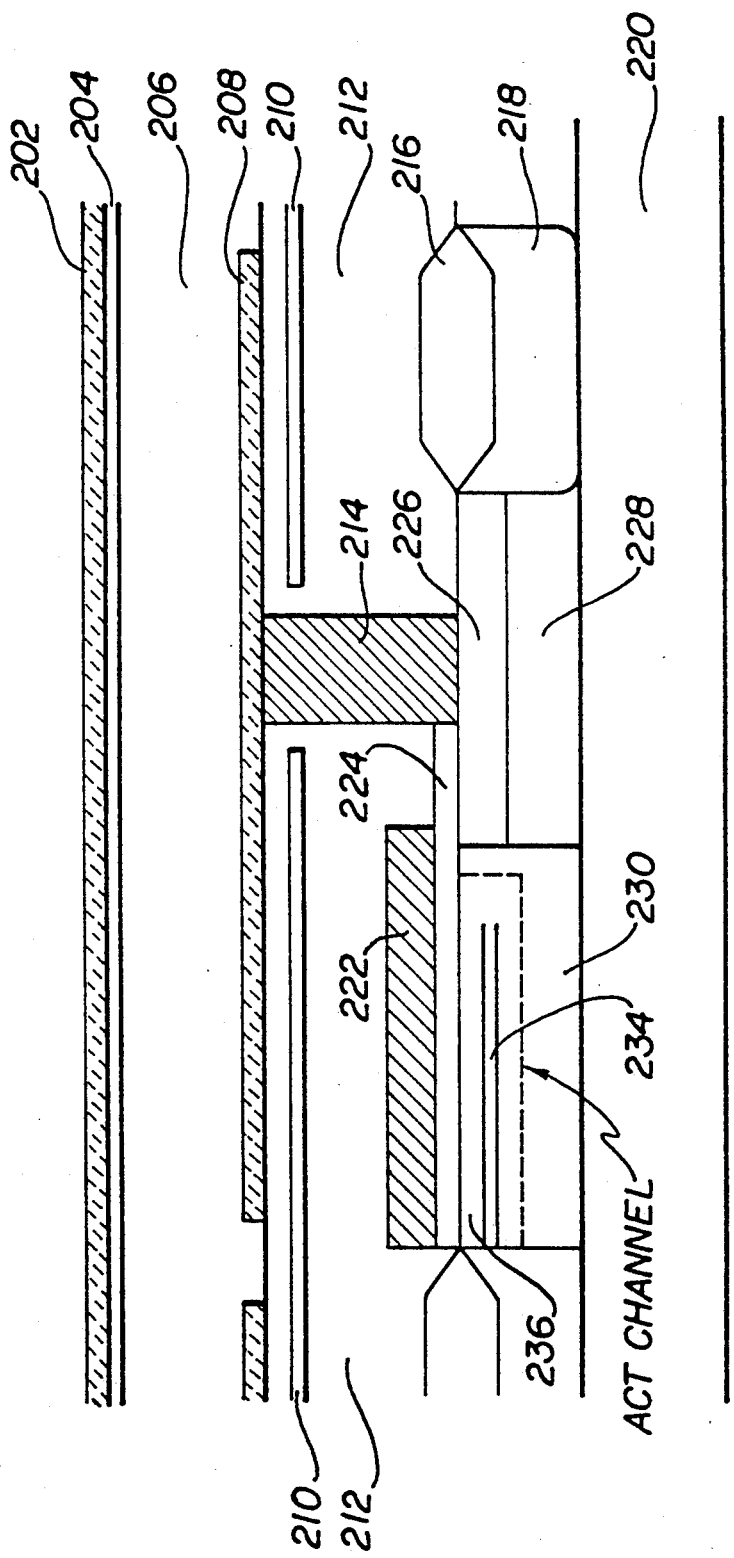
FIG. 2 is a cross sectional view of one imager cell illustrating the spatial relationship of the elements comprising the cell.

The four main elements of the imager cell, the APD, the BJT, the MISFET and the ACT channel, are compatible with each other and suitable for monolithic integration. FIG. 2 shows a cross section of the physical architecture of the cell. In this view, the ACT channel runs perpendicularly through the plane of the figure.

The APD of the preferred embodiment is comprised of a p type region 204, an intrinsic region 206, and an n type region 208. The p type region 204 is made from amorphous hydrogenated silicon carbide (a-Si$_{1-x}$C$_x$:(H) where $0 < X < 1$). The intrinsic region is made from an amorphous hydrogenated silicon (a-Si:(H)). The n type region is made from polysilicon. In the art to which this invention pertains, polycrystalline silicon is referred to as polysilicon.

An electrode 202 which is transparent to some portion of the electromagnetic spectrum forms the top surface of the APD. In the preferred embodiment of the present invention this electrode 202 is transparent to the visible portion of the spectrum and is comprised of an indium-tin-oxide (ITO) layer. This ITO layer of the preferred embodiment does not require a passivating topside layer. The ability to fabricate this structure without a topside layer simplifies optical and acoustic design considerations.

When photons pass through the transparent electrode 202 and into the reverse biased APD, a current is generated. This current passes out of the diode through an n-doped polysilicon plate 208 and an n-doped polysilicon pillar 214 into the n emitter 226 of a vertical npn BJT. The flat, rectangular polysilicon plate 208 may be fabricated in alternative shapes, such as circular and/or non-planar. The preferred embodiment utilizes a polysilicon region having two major surfaces.

A channel stop 218, comprising a p+ region, abuts the BJT and MISFET structures. In the preferred embodiment these p+ regions are formed by Be doping. Ion implantation of Be is the preferred method of achieving said doping. The channel stops serve to electrically isolate the BJT and MISFET structures from other electrical elements and signals which may be present in or on the imager chip.

The channel stops 218 of the preferred embodiment are designed as long strips which run through the imager array, with the ground contacts formed at both ends. The sheet resistance and length of the implanted channel stop strips must be considered carefully during the design stages in order to avoid forward biasing. Any currents passing through the channel stop strips will act to develop some voltage (V=IR). If the voltage in some part of the channel stop strip becomes greater than the diode turn-on voltage then unwanted conduction will take place. One result of this unwanted conduction is corruption of the stored image data.

A light shield 210 having two major surfaces, serves to isolate the underlying BJT, MISFET and ACT channel from performance degrading photons. In the preferred embodiment the light shield is formed from a layer of molybdenum.

If the light shield is formed from a conductive material, such as molybdenum, then it must be electrically isolated from the photodetector. In the preferred embodiment an insulating material is disposed between the photodetector (including the conductive pillar) and the light shield. Additionally, a conductive light shield should be grounded in order to eliminate the possibility of trapped charge in the light shield. Charge trapped in the light shield may adversely affect the performance of the underlying MISFET structure. Such effects might be manifested in shifts of MISFET thick field threshold voltage.

The light shield 210 is physically and electrically separated from the underlying BJT, MISFET and ACT channel by a dielectric layer 212. In the preferred embodiment phosphosilicate-glass (PSG) is used as the dielectric layer although other dielectric materials, such as boro-phospho-silicate glass (BPSG), ZnO or BaTiO$_3$ may also be suitable.

Both ZnO and BaTiO$_3$ can be used to create an insulating layer which is also a piezoelectric film. If a material is chosen which is more piezoelectric than the GaAs substrate, a surface acoustic wave can be generated having a deeper potential well than could be obtained in GaAs alone. That is, the voltage potential developed by the SAW would be larger.

The MISFET structure consists of a gate electrode 222, a dielectric 224, and semiconducting material 230. In the present invention the gate electrode is separated from the semiconductor material by the dielectric. Said dielectric may be either Si$_3$N$_4$ or undoped GaAs. As can be seen in FIG. 2, the gate 222 physically spans a region in which an ACT channel exists, as well as a laterally adjoining p region and a portion of the n+ emitter 226 region.

The BJT portion of the present invention is fabricated using the n substrate 220 as the collector. A p type base 228 region is then formed vertically above the collector. The corresponding n+ emitter 226 is formed above the base, as shown in FIG. 2, so that taken together there is an npn stack.

The ACT device operation requires confinement of the charge to be transported, within a thin layer 234 of GaAs sandwiched between two relatively thicker layers of AlGaAs 230, 236. The GaAs quantum well 234 is undoped while the lower AlGaAs layer 230 is p type doped and the top layer 236 is lightly n. doped. In the preferred embodiment, Be is the dopant used to achieve p type doping in the lower AlGaAs layer.

3. Imager Operation

Light from an object to be imaged is focused upon an array of photodetector elements. The preferred embodiment utilizes a two-dimensional array. The number of photons incident at any particular point on the array is a function of the object being imaged. The photodetectors generate an electrical charge proportional to the number of incident photons. This photogenerated charge, which electrically represents an image of the object, is temporarily stored. Alternatively, this process could be described as converting electromagnetic image information into a two dimensional array of discrete analog charge packets and then storing those packets.

In order to transfer the stored image information from a large number of photodetector elements it is necessary to use a serial read out technique. However, in order to meet HDTV video frame rate requirements, the serial read out must be fast.

High speed read out, or accessing, in the present invention, is achieved by gating the stored charge into channels where an electric potential, resulting from a surface acoustic wave, sweeps the charge to other chip circuitry for further processing.

Figure 3:
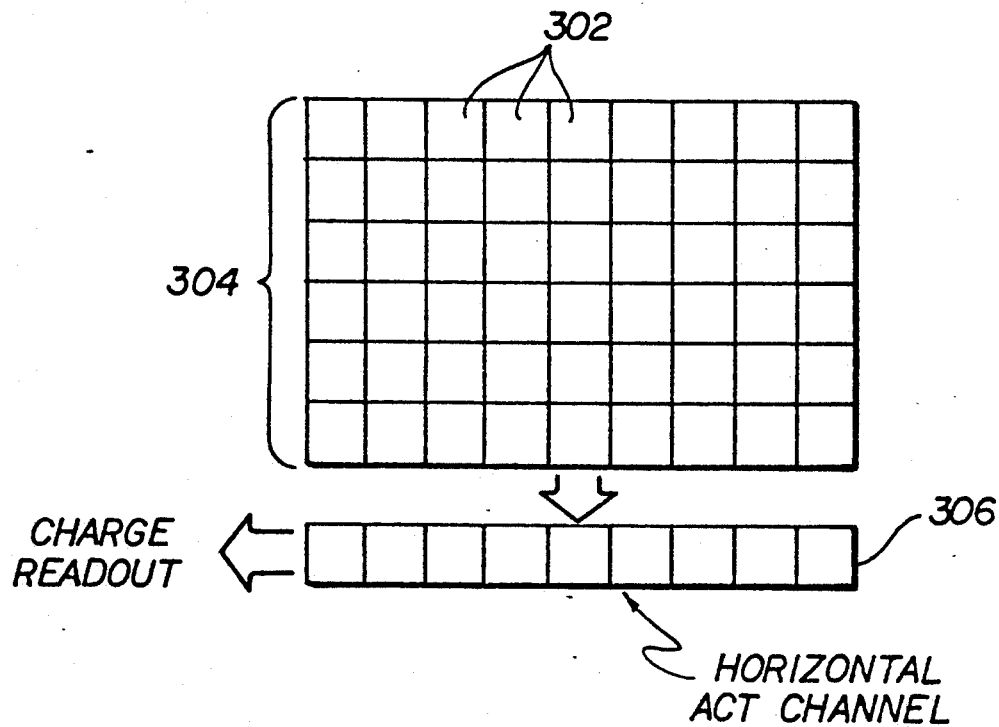
FIG. 3 is a block diagram showing a two dimensional imager array and a horizontal ACT charge read out register.

The imager cells 302 are arranged in a two dimensional array 304 of rows and columns as shown in FIG. 3. During the read out operation, a parallel transfer of all the charge packets in a row of the imager array to an intermediate storage row 306 is performed by acoustic charge transport. Each charge packet in the intermediate storage row 306 is then serially transferred out, by means of acoustic charge transport, for further processing.

The novel combination of a silicon based photodetector with an ACT read out structure in GaAs can be used to form the basis of alternative read out schemes such as frame transfer. In a frame transfer all the charge packets in the imager array are transferred en masse, rather than row by row, to an equally sized storage array. This storage array is typically a non-imaging array.

A detailed description of the operation of the imager components is included below.

By reverse biasing the APD, a depletion region is created within the photodiode wherein current multiplication through impact ionization may take place. Photons incident upon the imager generate the charge which initiates current multiplication. This multiplied photo-initiated charge passes to the emitter 110 of BJT 104 and is stored therein.

The APD must be reverse-biased in order to operate. Because of this requirement, a transparent electrode 202 is used to make electrical contact to the p side of the APD.

Charge from the APD is stored primarily by the capacitance of the emitter-base junction. Although the emitter node of a BJT is used for charge storage in the preferred embodiment, other means for storing charge, such as a diode or parallel plate capacitor, may be used. A means for charge storage is physically and electrically associated with the photodetector elements.

There are three possible mechanisms by which this stored charge may move. One mechanism is by way of reverse biased diode leakage currents into the base and channel stop regions. A second mechanism is the forward-biased diode current which flows when the emitter node becomes negatively biased with respect to the base node by more than a diode drop. A third mechanism is the creation of a conductive pathway from the charge storage node to the ACT channel by way of MISFET action.

Reverse-biased diode leakage current acts over time to corrupt the stored image data. This puts a practical limit on the size of the imager array since the image data is read out essentially serially. Serial read out means that a finite time is required to access all the storage nodes in the imager array. As the array becomes larger the access cycle time becomes longer. The longer a storage node must wait to be accessed, the greater will be the image data corruption due to reverse biased diode leakage current.

When a large number of electrons collect in the emitter of BJT 104, said emitter will become sufficiently negative with respect to the grounded base, so that the base-emitter diode will become forward biased. Forward biasing will result in current flow until the number of electrons is sufficiently reduced so that the diode turns off. The result of this action is essentially to limit the amount of charge available for read out. That is, the magnitude of the stored charge is clamped. This limits the imager dynamic range but minimizes blooming, which has been a problem for imagers of older technology.

The use of the vertical BJT structure to remove excessive charge is a particularly useful feature of the preferred embodiment. Without the use of the BJT, excess charge would pass into the channel stop. Current in the channel stop creates a voltage, the magnitude of which is a function of the current and the channel stop sheet resistivity. The voltage developed could possibly forward bias some channel stop-emitter junction resulting in image data corruption. The BJT of the present invention conducts the excess charge into the substrate.

Charge transfer from storage node to ACT channel occurs when a conductive pathway between them is created by action of the MISFET structure. The MISFET structure provides a means of controllably transferring charge from the storage nodes to the ACT channels.

Once the charge representing the image data has been transferred to the ACT channel, it is swept along by the potential resulting from a surface acoustic wave. The SAW forces the charge along the channel to that part of the chip where further processing may take place.

It is to be understood that the forms of the invention described and illustrated herein are to be taken as preferred examples of the same, and that various changes in the arrangement of components or type of materials may be made without departing from the spirit of the invention or scope of the claims.

What we claim is:

1. An imager comprising:
    a) an array of discrete photodetector elements, each for producing photogenerated charge;
    b) a plurality of acoustic charge transport channels coupled to said photodetector elements;
    a means for collecting and transferring said photogenerated charges to said acoustic charge transport channels; and
    a means for generating a surface acoustic wave for sweeping out said photogenerated charges from said acoustic charge transport channels.

2. The imager of claim 1, wherein said photodetector comprises:
a) a photodiode; and
b) a means for applying a reverse bias voltage to said photodiode.

3. The imager of claim 2, wherein said photodiode comprises a silicon based diode having an n type region and a p type region.

4. The imager of claim 1 further comprising an electrically insulating layer disposed between said photodetector elements and said acoustic charge transport channels.

5. The imager of claim 4, wherein said insulating layer is a material selected from the group consisting of phosphosilicate-glass, boro-phospho-silicate glass, ZnO and $BaTiO_3$.

6. The imager of claim 1, wherein said photodetector comprises:
a) an hydrogenated amorphous silicon based avalanche photodiode having a p type region, an intrinsic region and an n type region; said n type region having two major surfaces, the first major surface of which is in electrical contact with said intrinsic region;
b) a transparent electrode in electrical contact with said p type region; c) a light shield having two major surfaces, one surface of which faces the second major surface of said n type region.

7. The imager of claim 6, wherein said transparent electrode comprises a layer of indium-tin-oxide.

8. The imager of claim 6, wherein said light shield is comprised of a layer of molybdenum.

9. The imager of claim 6, wherein said light shield has an opening to permit electrical connection to be made to said polycrystalline silicon region.

10. The imager of claim 6, wherein said p type region of said photodiode comprises $a\text{-}Si_{1-x}C_x\text{:}(H)$ where $0 < x < 1$.

11. The imager of claim 6, wherein said intrinsic region of said photodiode comprises a-Si:(H).

12. The imager of claim 6, wherein said n type region of said photodiode comprises n type polysilicon.

13. The imager of claim 1, wherein said array of photodetector elements is a two dimensional array.

14. The imager of claim 1, wherein said photodetector elements are responsive to electromagnetic radiation in the visible region of the spectrum.

15. The imager of claim 1, further comprising a means for storing charge, which is physically and electrically associated with each of said photodetector elements.

16. An imager as claimed 15, wherein said means for storing charge is comprised of an emitter node of an npn BJT.

17. The imager of claim 15 further comprising a means for controllably transferring charge coupled between said ACT channel and said means for storing charge.

18. The imager of claim 17, wherein said means for controllably transferring charge is a MISFET structure.

19. The imager of claim 16, wherein said BJT acts to clamp the amount of charge stored at said emitter node.

20. The image of claim 1, wherein said acoustic charge transport channel comprises a GaAs region surrounded by an AlGaAs region.

21. A semiconductor heterostructure camera element cell comprising:
a) an n type GaAs substrate;
b) a three terminal npn bipolar junction transistor having an emitter, base and collector wherein said GaAs substrate forms the collector;
c) an amorphous silicon avalanche photodiode having a p type region, an intrinsic region and an n type region,
d) said n type region comprising a polycrystalline silicon plate electrically connected to the intrinsic region of said photodiode;
d) a polycrystalline silicon pillar disposed between said electrically connecting said polycrystalline silicon plate and said emitter of said bipolar junction transistor;
e) an acoustic charge transport channel in said GaAs substrate;
f) a MISFET structure having a gate electrode, an insulating layer and a semiconducting layer, for transferring charge stored in said emitter to said acoustic charge transport channel; and
g) a p$^+$ stop abutting said bipolar junction transistor and electrically connected to said base.

22. The semiconductor heterostructure camera element cell of claim 21, wherein said insulating layer of said MISFET structure is a material selected from the group consisting of $Si_3N_4$ and undoped GaAs.

* * * * *